US012658895B2

(12) United States Patent
Park

(10) Patent No.: US 12,658,895 B2
(45) Date of Patent: Jun. 16, 2026

(54) VOLTAGE REGULATOR

(71) Applicant: SAMSUNG ELECTRONICS CO., LTD., Suwon-si (KR)

(72) Inventor: Eunje Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/770,011

(22) Filed: Jul. 11, 2024

(65) Prior Publication Data

US 2025/0088178 A1 Mar. 13, 2025

(30) Foreign Application Priority Data

Sep. 7, 2023 (KR) ........................ 10-2023-0119107

(51) Int. Cl.
*H03K 3/017* (2006.01)
*H03K 3/037* (2006.01)
*H03K 5/00* (2006.01)

(52) U.S. Cl.
CPC ............. *H03K 3/017* (2013.01); *H03K 3/037* (2013.01); *H03K 5/00006* (2013.01)

(58) Field of Classification Search
CPC ..... H03K 3/017; H03K 3/037; H03K 5/00006
See application file for complete search history.

(56) References Cited

U.S. PATENT DOCUMENTS

| | | | |
|---|---|---|---|
| 6,492,862 B2 | 12/2002 | Nakahara | |
| 7,358,794 B2 | 4/2008 | Kawagoshi | |
| 7,671,572 B2 * | 3/2010 | Chung | H02M 3/156 |
| | | | 323/283 |
| 7,928,796 B2 | 4/2011 | Namekawa | |
| 8,098,528 B2 | 1/2012 | Ryu | |
| 9,264,053 B2 | 2/2016 | Englekirk | |
| 10,305,378 B2 | 5/2019 | Plavec et al. | |
| 11,557,964 B2 | 1/2023 | Pullen et al. | |
| 2001/0017566 A1 | 8/2001 | Nakahara | |
| 2005/0189984 A1 * | 9/2005 | Kawagoshi | H02M 3/073 |
| | | | 327/538 |
| 2009/0315598 A1 * | 12/2009 | Namekawa | H02M 3/073 |
| | | | 327/157 |
| 2010/0054074 A1 | 3/2010 | Ryu | |
| 2015/0002195 A1 | 1/2015 | Englekirk | |
| 2018/0145588 A1 * | 5/2018 | Plavec | G11C 7/14 |
| 2021/0376719 A1 | 12/2021 | Pullen et al. | |

FOREIGN PATENT DOCUMENTS

| | | |
|---|---|---|
| JP | 2003168963 | 6/2003 |
| JP | 2010050825 | 3/2010 |

* cited by examiner

*Primary Examiner* — Lincoln D Donovan
*Assistant Examiner* — James G Yeaman
(74) *Attorney, Agent, or Firm* — MORGAN, LEWIS & BOCKIUS LLP

(57) ABSTRACT

An electronic device according to an embodiment includes a clock generator generating a first clock signal having a first frequency, and a voltage regulating system configured to receive the first clock signal, receive a detection signal indicating that a boost voltage is within a first voltage range, adjust the first frequency of the first clock signal to generate a second clock signal having a second frequency based on a period during which the detection signal is maintained at a constant level, and generate the boost voltage based on the second clock signal.

18 Claims, 11 Drawing Sheets

VOLTAGE REGULATOR

CROSS-REFERENCE TO RELATED APPLICATION

This patent application claims priority under 35 U.S.C. § 119 to Korean Patent Application No. 10-2023-0119107 filed in the Korean Intellectual Property Office on Sep. 7, 2023, the disclosure of which is incorporated by reference in its entirety herein.

(a) TECHNICAL FIELD

The present disclosure relates to a voltage regulator.

(b) DISCUSSION OF RELATED ART

A voltage regulator is configured to maintain a level of an output voltage at a target voltage level. For example, the voltage regulator may decrease the level of the output voltage when the level of the output voltage is higher than the target voltage level, and increase the level of the output voltage when the level of the output voltage is lower than the target voltage level. The voltage regulator may be used in a variety of electronic devices that require a constant voltage. However, if the response of the electronic device is slow in responding to changes in the level of the output voltage of the voltage regulator, there may be an issue in which the level of the output voltage becomes higher or lower than the target voltage level.

SUMMARY

At least one embodiment of the present disclosure relates to a voltage regulator including a charge pump that generates a charge pump voltage with a small ripple voltage.

An electronic device according to an embodiment includes a clock generator and a voltage regulating system. The clock generator generates a first clock signal having a first frequency. The voltage regulating system is configured to receive the first clock signal, receive a detection signal indicating that a boost voltage is within a first voltage range, adjusts the first frequency of the first clock signal to generate a second clock signal having a second frequency based on a period during which the detection signal is maintained at a constant level, and generate the boost voltage based on the second clock signal.

A method of operating an electronic device according to an embodiment includes generating a first clock signal having a first frequency, receiving a detection signal indicating that a boost voltage is within a first voltage range, adjusting the first frequency of the first clock signal based on a period when the detection signal is maintained for generating a second clock signal having a second frequency, and generating the boost voltage based on the second clock signal.

An electronic device according to an embodiment includes a clock generator and a voltage regulating system. The clock generator is configured to generate a first clock signal having a first frequency. The voltage regulator configured to receive the first clock signal, receive a detection signal indicating that a boost voltage is within a first voltage range, skip at least one pulse of the first clock signal based on a period during which the detection signal is maintained to generate a second clock signal having a second frequency, and generate the boost voltage based on the second clock signal.

BRIEF DESCRIPTION OF THE DRAWINGS

FIG. 1 is a block diagram illustrating an electronic device according to an embodiment.

DETAILED DESCRIPTION

Figure 2:
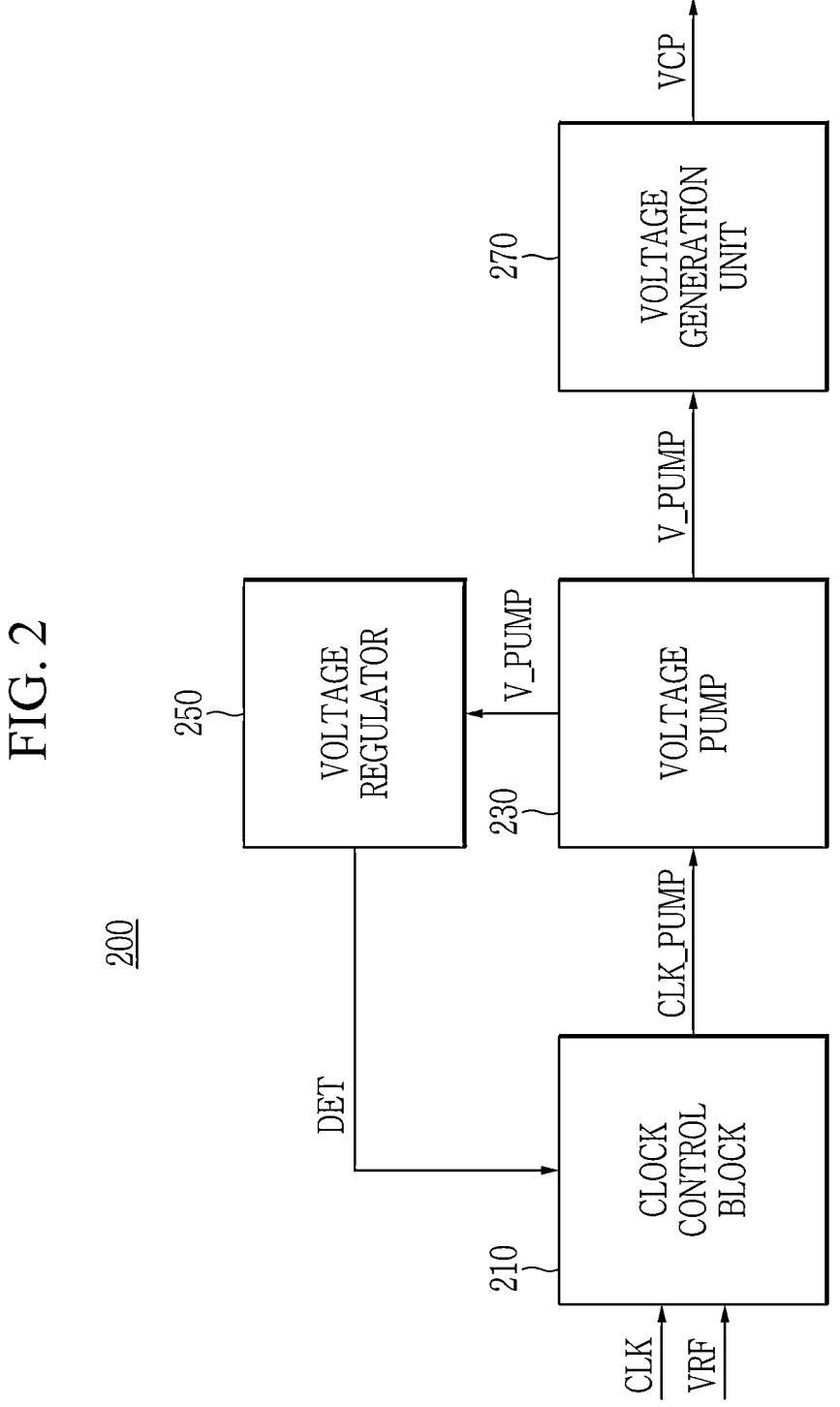
FIG. 2 is a block diagram illustrating a voltage regulator system that may be included in the electronic device according to an embodiment.

Hereinafter, the present disclosure will be described in detail hereinafter with reference to the accompanying drawings, in which embodiments of the present disclosure are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. In a flowchart described with reference to drawings in this description, the operation order may be changed, several operations may be merged, certain operations may be divided, and specific operations may not be performed.

In the description, expressions described in the singular in this specification may be interpreted as the singular or plural unless an explicit expression such as "one" or "single" is used. Although terms of "first," "second," and the like are used to explain various constituent elements, the constituent elements are not limited to such terms. These terms are only used to distinguish one constituent element from another constituent element.

Figure 1:
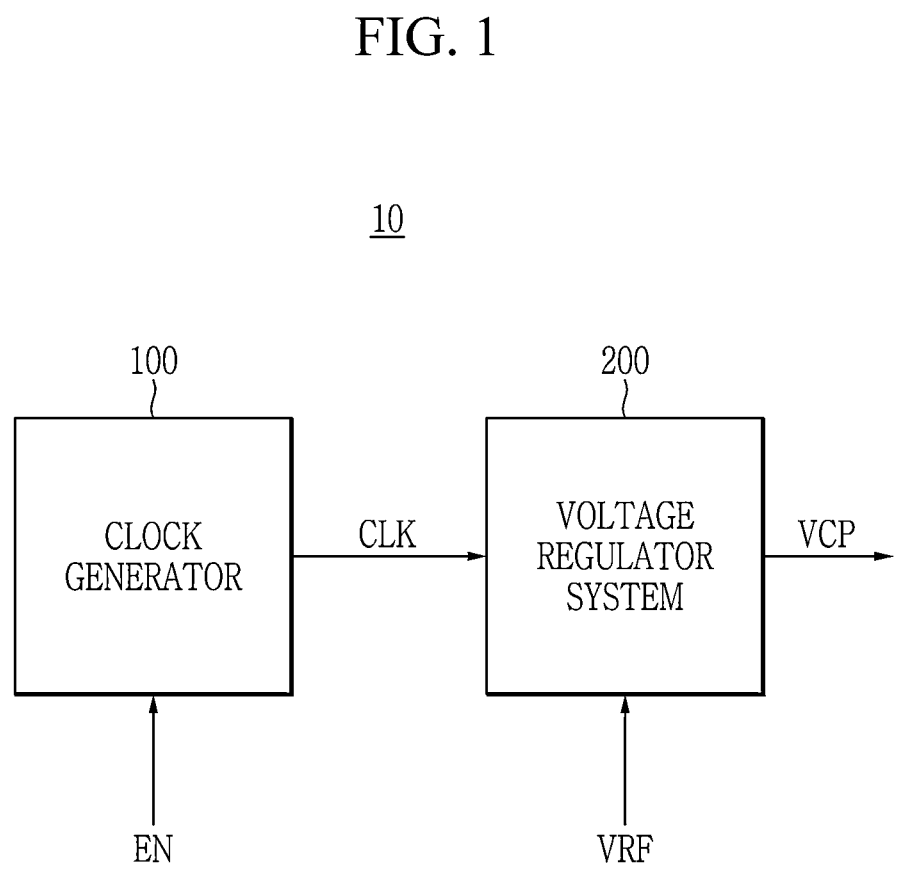
Figure 3:
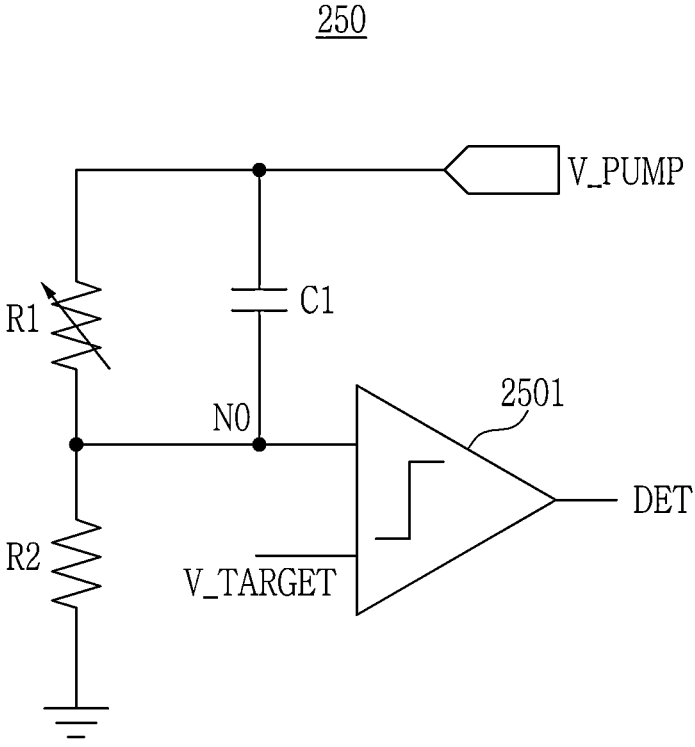
FIG. 3 is a circuit diagram illustrating a voltage generator that may be included in the voltage regulator system according to an embodiment.

FIG. 1 is a block diagram illustrating an electronic device according to an embodiment. FIG. 2 is a block diagram illustrating a voltage regulator system that may be included in the electronic device according to an embodiment. FIG. 3 is a circuit diagram illustrating a voltage generator that may be included in the voltage regulator system according to an embodiment.

Referring to FIG. 1, an electronic device 10 may include a clock generator 100 and a voltage regulating system 200.

The electronic device 10 may generate a boost voltage VCP based on an activation signal EN and a reference voltage VRF. In an embodiment, the boost voltage VCP is at a higher level than an external voltage received by the electronic device 10 from the outside. The external voltage may power the electronic device 10. In some embodiments, the electronic device 10 may receive the reference voltage VRF and the activation signal EN from an electronic circuit external to the electronic device 10. The activation signal EN may be a signal that activates the clock generating operation of the clock generator 100. The reference voltage VRF may be a reference voltage for the electronic device 10 to generate the boost voltage VCP. For example, the reference voltage VRF may be the target voltage.

In some embodiments, the electronic device 10 may be used to assist write operations of a memory device. For example, the electronic device 10 may be a circuit built into a memory device, and may generate an adjusted voltage for a write operation of a memory cell array in the memory device. The activation signal EN may be a signal that activates the electronic device 10 for a write operation of the memory device. The reference voltage VRF may be a reference voltage for a write operation of the memory device.

The clock generator 100 may generate a clock signal CLK based on the activation signal EN. The clock signal CLK may be a signal that toggles between a first logic level and a second logic level different from the first logic level.

The voltage regulating system 200 may generate the boost voltage VCP based on the reference voltage VRF and the clock signal CLK. The boost voltage VCP may be used in other circuits in addition to the electronic device 10.

The electronic device 10 may include a plurality of voltage regulating systems 200, and each voltage regulating system 200 may generate a separate boost voltage.

Referring to FIG. 1 and FIG. 2 together, the voltage regulating system 200 may include a clock control block 210 (e.g., a clock control circuit), a voltage pump 230 (e.g., a voltage pump circuit), a voltage regulator 250 (e.g., a voltage regulator circuit), and a voltage generator 270.

The clock control block 210 may generate a pump clock signal CLK_PUMP based on the clock signal CLK, the reference voltage VRF, and a detection signal DET. The detection signal DET may indicate that a charge pump voltage V_PUMP is within a first voltage range. In an embodiment, the detection signal DET indicates that when charge pump voltage V_PUMP enters a stable section. The pump clock signal CLK_PUMP may be a signal with a lower frequency than the clock signal CLK. For example, the clock signal CLK may have a first frequency, and the pump clock signal CLK_PUMP may have a second frequency lower than the first frequency. The frequency of the pump clock signal CLK_PUMP may be set in advance. In an embodiment, the clock signal CLK includes a plurality of first pulses, and the pump clock CLK_PUMP includes a plurality of second pulses. In an embodiment, the pump clock signal CLK_PUMP is a signal that includes the plurality of second pulses by skipping some of the plurality of first pulses of the clock signal CLK. In some embodiments, the amplitude of the pump clock signal CLK_PUMP may be smaller than the amplitude of the clock signal CLK. In an embodiment, the frequency of the pump clock signal CLK_PUMP is set based on the time until the voltage pump 230 generates the charge pump voltage V_PUMP in response to the pump clock signal CLK_PUMP, the level of the power source voltage used by the electronic device 10, and frequency of the clock signal CLK. The clock control block 210 may transfer the generated pump clock signal CLK_PUMP to the voltage pump 230.

The clock control block 210 may further receive a plurality of signals for generating the pump clock signal CLK_PUMP in addition to the clock signal CLK and the reference voltage VRF.

In some embodiments, the clock control block 210 may further receive a signal for controlling whether the voltage regulating system 200 including the clock control block 210 operates. For example, the electronic device 10 may select one voltage regulator among a plurality of voltage regulators, and may transmit a signal instructing the operation of the clock control block 210 to the selected voltage regulator.

The voltage pump 230 may generate the charge pump voltage V_PUMP in response to the pump clock signal CLK_PUMP. The voltage pump 230 may generate the charge pump voltage V_PUMP having a voltage level higher than the power voltage.

In some embodiments, the voltage pump 230 may generate the charge pump voltage V_PUMP during a period in which the pump clock signal CLK_PUMP toggles. For example, when the pump clock signal CLK_PUMP changes from the first level to the second level, the voltage pump 230 may increase the voltage value of the charge pump voltage V_PUMP, and the voltage pump 230 may increase the voltage value of the charge pump voltage V_PUMP even when the pump clock signal CLK_PUMP changes from the second level to the first level. In the case of a voltage pump that generates a lower voltage than the external power source, the voltage value may decrease when the pump clock signal CLK_PUMP changes. For example, the first level may be a high level and the second level may be a low level. In an embodiment, the voltage pump 230 stops increasing the charge pump voltage V_PUMP during a period in which the pump clock signal CLK_PUMP is maintained at a constant voltage level. In an embodiment, the voltage pump 230 generates the charge pump voltage V_PUMP using a coupling phenomenon of a capacitor and charge sharing. Accordingly, the voltage pump 230 may take a certain amount of time to generate the charge pump voltage V_PUMP in response to the pump clock signal CLK_PUMP. If the speed at which the pump clock signal CLK_PUMP toggles is faster than the time for the voltage pump 230 to generate the charge pump voltage V_PUMP in response to the pump clock signal CLK_PUMP, the voltage pump 230 may continuously increase or decrease the voltage value of the charge pump voltage V_PUMP.

Additionally, the degree to which the voltage value of the charge pump voltage V_PUMP increases may be based on the amplitude of the clock signal CLK. For example, if the amplitude of the clock signal CLK is large, the charge pump voltage V_PUMP may increase or decrease with a high slope, and if the amplitude of the clock signal CLK is small, the charge pump voltage V_PUMP may increase or decrease with a low slope.

The voltage pump 230 may transfer the generated charge pump voltage V_PUMP to the pump voltage regulator 250.

In some embodiments, the clock control block 210 may further receive a signal from an external device for controlling whether to generate the pump clock signal CLK_PUMP. For example, when a signal instructing the voltage regulating system 200 to operate in clock skip mode is received, the clock control block 210 may perform an operation of generating the pump clock signal CLK_PUMP based on the clock signal CLK. As another example, when a signal instructing the voltage regulating system 200 not to operate in clock skip mode is received, the clock control block 210 does not perform the operation of generating the pump clock signal CLK_PUMP based on the clock signal CLK, and may transfer the clock signal CLK to the voltage pump 230 as the pump clock signal CLK_PUMP.

For example, there may be a plurality of circuits using one boost voltage VCP. While one of the plurality of circuits is using the boost voltage VCP, there is a possibility that the charge pump voltage V_PUMP does not increase to the desired level.

Accordingly, in this case, the external device may transmit a signal instructing the voltage regulating system 200 not to operate in clock skip mode. In other words, the external device may instruct the voltage regulating system 200 to operate in the clock skip mode only when the boost voltage VCP is in a stable section. The stable section may be a section where fluctuations occur due to a ripple voltage.

The voltage regulator 250 may generate the detection signal DET based on the charge pump voltage V_PUMP received from the voltage pump 230.

The clock control block 210 according to an embodiment adjusts the frequency of the pump clock signal CLK_PUMP, and the voltage pump 230 generates the charge pump voltage V_PUMP based on the frequency-adjusted pump clock signal CLK_PUMP. The voltage regulator 250 may control the pump clock signal CLK_PUMP to control the voltage pump 230 to generate the charge pump voltage V_PUMP having a predetermined voltage level. Accordingly, the voltage regulator 250 may control the charge pump voltage V_PUMP to have a predetermined target level.

Referring to FIG. 2 and FIG. 3 together, the voltage regulator 250 may include a first resistor R1, a second resistor R2, a capacitor C1, and an amplifier 2501.

The charge pump voltage V_PUMP may be input to one end of the first resistor R1, and a first node N0 may be connected to the other end of the first resistor R1. In an embodiment, the first resistor R1 has a variable value that is adjustable. For example, the first resistor R1 may be a variable resistor.

One end of the second resistor R2 may be connected to the first node N0, and the other end of the second resistor R2 may be connected to a ground power source providing a ground voltage. In some embodiments, the second resistor R2 may have a predetermined resistance value.

One end of the first capacitor C1 may be connected to the first node N0, and the charge pump voltage V_PUMP may be input to the other end of the first capacitor C1.

A target voltage V_TARGET may be input to a first input terminal of the amplifier 2501, and the voltage of the first node N0 may be input to a second input terminal of the amplifier 2501. In some embodiments, the voltage of the first node N0 may be a voltage reduced by a resistance ratio from the charge pump voltage V_PUMP. The amplifier 2501 may compare the target voltage V_TARGET and the voltage of the first node N0 to generate a comparison result and output the detection signal DET based on the comparison result.

In addition, the detection signal DET generated by the voltage regulator 250 is transferred back to the clock control block 210, and the clock control block 210 may generate the pump clock signal CLK_PUMP based on the detection signal DET. Thereafter, the voltage pump 230 may generate the charge pump voltage V_PUMP based on the pump clock signal CLK_PUMP. Accordingly, the voltage pump 230 may keep the charge pump voltage V_PUMP constant at the target voltage V_TARGET*resistance ratio level.

However, the charge pump voltage V_PUMP may include fluctuations due to a ripple voltage. If the charge pump voltage V_PUMP has an excessively large value due to the ripple voltage, the device in a circuit using the charge pump voltage V_PUMP may become damaged. If the charge pump voltage V_PUMP has a small value due to the ripple voltage, the charge pump voltage V_PUMP may violate the margin of a headroom of the voltage generator 270, causing the circuit using the charge pump voltage V_PUMP to fail to perform normal operations.

The voltage generator 270 may generate the boost voltage VCP based on the charge pump voltage V_PUMP received from the voltage pump 230. The boost voltage VCP may be used by other constituent elements in the electronic device 10. If the charge pump voltage V_PUMP changes, the boost voltage VCP generated based thereon may also be affected.

Figure 4:
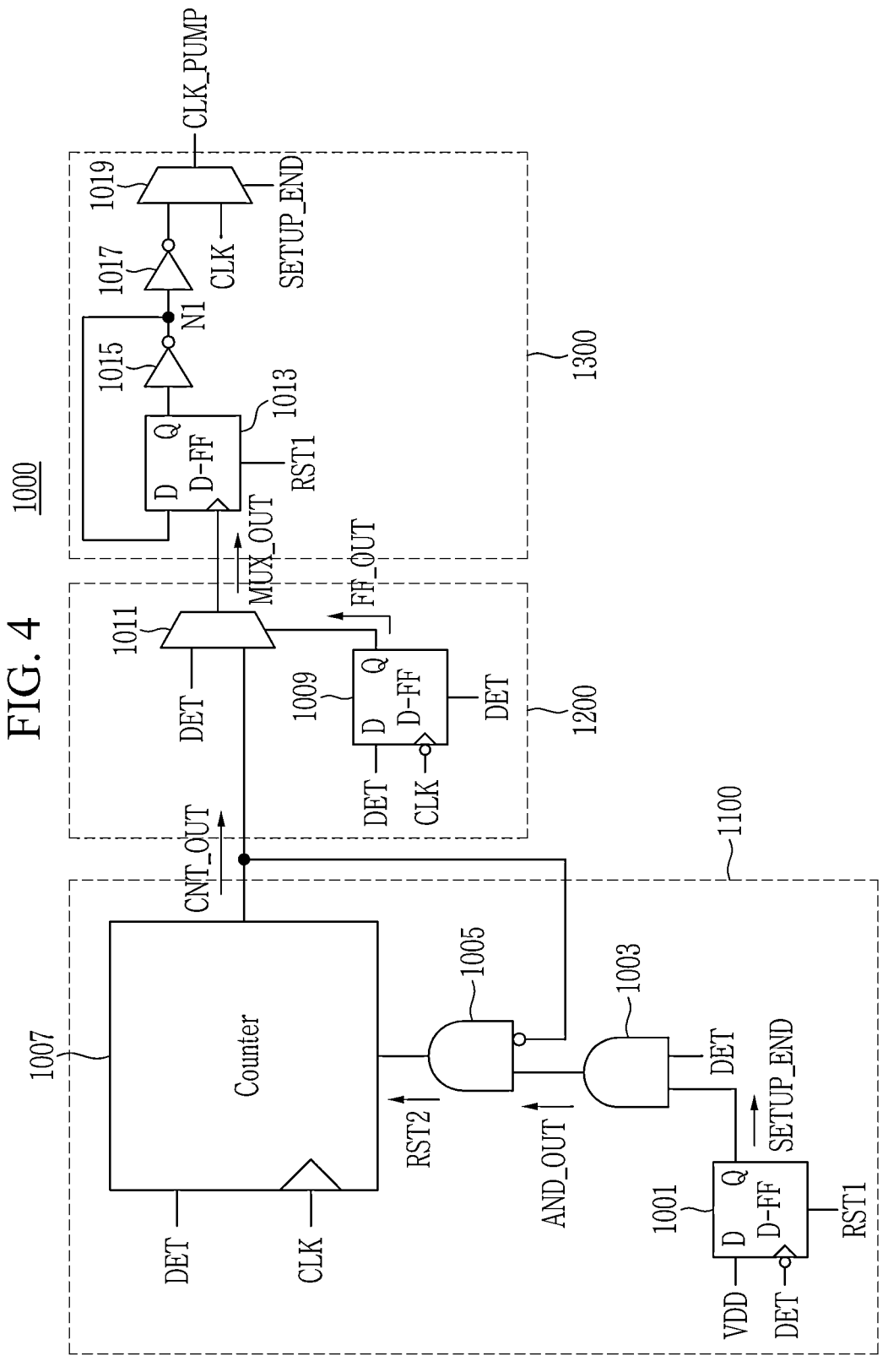
FIG. 4 is a diagram illustrating a clock control block that may be included in the voltage regulator system according to an embodiment.

FIG. 4 is a diagram illustrating a clock control block according to an embodiment.

Referring to FIG. 4, a clock control block 1000 may include a first circuit 1100, a second circuit 1200, and a third circuit 1300. The clock control block 1000 may be used to implement the clock control block 210 of FIG. 2.

The first circuit 1100 may be a circuit that determines whether the clock control block 1000 operates. The first circuit 1100 may receive a first reset signal RST1, a power source voltage VDD, the detection signal DET, and the clock signal CLK to generate a counter output signal CNT_OUT.

Referring to FIG. 4, the first circuit 1100 may include a first flip-flop 1001, a first AND gate 1003, a second AND gate 1005, and a counter 1007 (e.g., a counter circuit). The output terminal of the first flip-flop 1001 is connected to the input terminal of the first AND gate 1003, the output terminal of the first AND gate 1003 is input to the input terminal of the second AND gate 1005, and the output terminal of the second AND gate 1005 may be input to the counter 1007. The output of the counter 1007 may be transmitted to the second circuit 1200.

The detection signal DET may be inverted and input to the clock terminal of the first flip-flop 1001. An input terminal D of the first flip-flop 1001 may be connected to a node providing the power source voltage VDD. In an embodiment, the first flip-flop 1001 is a D-flip-flop having the input terminal D and an output terminal Q. The first flip-flop 1001 may latch the power source voltage VDD in synchronization with the falling edge of the detection signal DET and output the power source voltage VDD as a first setup signal SETUP_END.

The first setup signal SETUP_END may be a signal indicating that the setup section of the charge pump voltage V_PUMP has ended. The section that generates the charge pump voltage V_PUMP may include a setup period corresponding to the setup section and a stable period corresponding to the stable section. The setup section may be a section until the charge pump voltage V_PUMP first reaches the target level. The stable section is the section after the setup section, and may be a section where fluctuations occur due to a ripple voltage.

The first flip-flop 1001 may be reset by the first reset signal RST1. When the first reset signal RST1 is at a low level, the first flip-flop 1001 may be reset. In some embodiments, the first reset signal RST1 may be a signal received from the outside to control whether the clock control block 1000 operates.

The first AND gate 1003 may receive the first setup signal SETUP_END and the detection signal DET, and perform an AND operation on the first setup signal SETUP_END and the detection signal DET. The first AND gate 1003 may output the result of the AND operation as a first AND output signal AND_OUT. In some embodiments, the first AND gate 1003 may generate the first AND output signal AND_OUT having a high level when each of the detection signal DET and the first setup signal SETUP_END has a high level. The output node of the first AND gate 1003 may be connected to the second AND gate 1005.

The second AND gate 1005 may receive the first AND output signal AND_OUT and a counter output signal CNT_OUT. The second AND gate 1005 may invert the counter output signal CNT_OUT and perform an AND operation on the inverted counter output signal CNT_OUT and the first AND output signal AND_OUT. The second AND gate 1005 may output a result of the AND operation as a second reset signal RST2. At this time, the counter output signal CNT_OUT may be a signal output from the counter 1007. In some embodiments, when the first AND output signal AND_OUT has a high level and the counter output signal CNT_OUT has a low level, the second reset signal RST2 having a high level may be generated. The output of the second AND gate 1005 may be connected to the counter 1007.

The counter 1007 may count the number of times an input signal is toggled and output the counter output signal CNT_OUT according to the counting result.

For example, the counter 1007 may count the detection signal DET in synchronization with the rising edge of the clock signal CLK to generate a counting result. The counter 1007 may output the counter output signal CNT_OUT when the counting result is equal to a predetermined counter value. The counter 1007 may reset the counter value when the second reset signal RST2 is at a low level. However, the present disclosure is not limited thereto, and the counter 1007 may count the detection signal DET in synchronization with the rising edge or falling edge of the clock signal CLK, or both the rising edge and the falling edge.

The second circuit 1200 may be a circuit that determines whether to operate the clock skip mode. The second circuit 1200 may receive the detection signal DET, the clock signal CLK, and the counter output signal CNT_OUT to output a selector output signal MUX_OUT.

The second circuit 1200 may include a second flip-flop 1009 and a first selector 1011 (e.g., a selector circuit or multiplexer). The output terminal of the second flip-flop 1009 may be input to the first selector 1011. The output of the first selector 1011 may be transferred to the third circuit 1300.

In the second flip-flop 1009, the clock signal CLK may be inverted and input to the clock terminal. The input terminal D of the second flip-flop 1009 may be connected to a node receiving the detection signal DET. In some embodiments, the second flip-flop 1009 may be a D-flip-flop having the input terminal D and the output terminal Q. The first flip-flop 1001 may latch the detection signal DET in synchronization with the falling edge of the clock signal CLK and output the detection signal DET as a flip-flop output signal FF_OUT.

The second flip-flop 1009 may be reset by the detection signal DET. When the detection signal DET is at a low level, the second flip-flop 1009 may be reset.

The first selector 1011 may receive the detection signal DET and the counter output signal CNT_OUT. The first selector 1011 may be controlled by the flip-flop output signal FF_OUT. The first selector 1011 may output the detection signal DET or the counter output signal CNT_OUT as the selector output signal MUX_OUT based on the flip-flop output signal FF_OUT. In some embodiments, the detection signal DET may be output when the flip-flop output signal FF_OUT is at a low level, and the counter output signal CNT_OUT may be output when the flip-flop output signal FF_OUT is at a high level.

The third circuit 1300 may be a circuit that selects a signal output from the clock control block 1000. The third circuit 1300 may receive the first reset signal RST1 and the selector output signal MUX_OUT, and output the pump clock signal CLK_PUMP.

The third circuit 1300 may include a third flip-flop 1013, a first inverter 1015, a second inverter 1017, and a second selector 1019 (e.g., a selector circuit or multiplexer). The output terminal of the third flip-flop 1013 is connected to the first inverter 1015, the output terminal of the first inverter 1015 is connected to the input terminal D of the third flip-flop 1013 and the second inverter 1017 and the output terminal of the second inverter 1017 may be connected to the input terminal of the second selector 1019.

The third flip-flop 1013 may receive the selector output signal MUX_OUT through the clock terminal. The input terminal D of the third flip-flop 1013 may be connected to a first terminal N1. In some embodiments, the third flip-flop 1013 may be a D-flip-flop having the input terminal D and the output terminal Q. The third flip-flop 1013 may be synchronized with the rising edge of the selector output signal MUX_OUT to latch the detection signal DET and output the detection signal DET.

The third flip-flop 1013 may be reset by the first reset signal RST1. When the first reset signal RST1 is at a low level, the third flip-flop 1013 may be reset. In some embodiments, the first reset signal RST1 may be a signal received from the outside to control whether the clock control block 1000 operates. The first inverter 1015 and the second inverter 1017 may be connected in series.

Meanwhile, the output of the third flip-flop 1013 inverted through the first inverter 1015 may be fed back to the input terminal D of the third flip-flop 1013. The second inverter 1017 may receive and invert the output of the first inverter 1015. That is, the output of the second inverter 1017 may be the same signal as the output of the third flip-flop 1013. Accordingly, the output of the third flip-flop 1013 may be delayed for a certain period of time.

The second selector 1019 may receive the output of the second inverter 1017 and the clock signal CLK of the second inverter 1017. The second selector 1019 may be controlled by the first setup signal SETUP_END. The second selector 1019 may output the output of the second inverter 1017 or the clock signal CLK as the pump clock signal CLK_PUMP based on the first setup signal SETUP_END. In some embodiments, when the first setup signal SETUP_END is at a high level, the second selector 1019 may output the output of the second inverter 1017 as the pump clock signal CLK_PUMP.

However, the present disclosure is not limited thereto, and the first flip-flop 1001, the second flip-flop 1009, and the third flip-flop 1013 may operate in synchronization with the rising edge of the detection signal DET.

Figure 5:
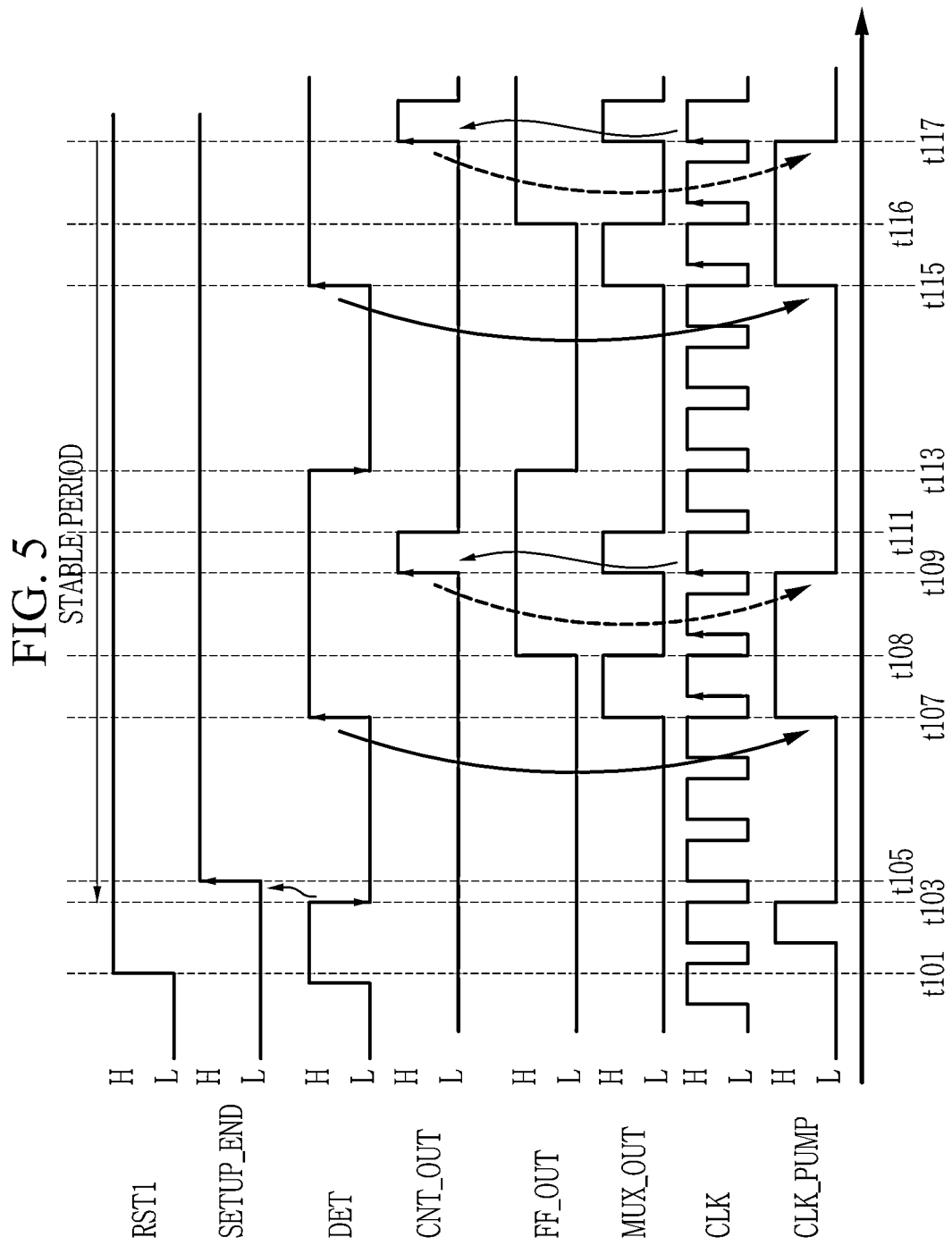
FIG. 5 is a timing diagram illustrating an operation of the clock control block of FIG. 4 according to an embodiment.

FIG. 5 is a timing diagram illustrating the operation of the clock control block of FIG. 4 according to an embodiment.

FIG. 5 illustrates the first reset signal RST1, the first setup signal SETUP_END, the reset detection signal DET, a counter output signal CNT_OUT, the clock signal CLK, and the pump clock signal CLK_PUMP. At this time, FIG. 5 illustrates a case where the variation of the detection signal DET is slower than the operation of the counter output signal CNT_OUT.

The first reset signal RST1 may transition to a high level at time point t101.

At this time, the detection signal DET may be at a high level. The detection signal DET at a high level may indicate when the charge pump voltage V_PUMP is located in the setup section. The first setup signal SETUP_END may be maintained at a low level by the detection signal DET at a high level.

The setup section may be used to quickly increase the charge pump voltage V_PUMP to reach the target level, so the clock skip mode need not operate. Accordingly, the clock control block 1000 may output the clock signal CLK as the pump clock signal CLK_PUMP.

At time point t103, the detection signal DET may transition from a high level to a low level.

The detection signal DET at a low level may indicate when the charge pump voltage V_PUMP has entered a stable section. In some embodiments, the time for the charge pump voltage V_PUMP to reach the target level may be predicted in advance, and thus the time point t103 may be set in advance.

At time point t105, the setup signal SETUP_END may transition to a high level in response to the detection signal DET at a low level.

The detection signal DET may transition from low level to high level at time point t107.

The first flip-flop 1001 may output the power source voltage VDD as the setup signal SETUP_END in response to the detection signal DET transitioning to a low level. Accordingly, the detection signal DET at a high level and the setup signal SETUP_END at a high level may be input to the first AND gate 1003, and the first AND gate output signal AND_OUT may transition to a high level.

The first AND gate output signal AND_OUT at a high level and an inverted counter output signal CNT_OUT may be input to the second AND gate 1005. Accordingly, the second reset signal RST2 may have a high level. Accordingly, the counter 1007 may operate. For example, the counter 1007 may operate to count the detection signal DET.

At time point t107, the second flip-flop 1009 may output the flip-flop output signal FF_OUT at a low level in synchronization with the falling edge of the clock CLK. The first selector 1011 may output the detection signal DET according to the flip-flop output signal FF_OUT at a low level. Accordingly, the selector output signal MUX_OUT may transition to a high level in response to the detection signal DET at a high level.

At time point t108, the second flip-flop 1009 may output the flip-flop output signal FF_OUT at a high level in synchronization with the falling edge of the clock signal CLK. The first selector 1011 may output the count output signal CNT_OUT according to the flip-flop output signal FF_OUT at a high level. Accordingly, the selector output signal MUX_OUT may transition to a low level in response to the count output signal CNT_OUT at a low level.

During time points t107-t109, the counter 1007 may count the detection signal DET in synchronization with the high level or a rising edge of the clock signal CLK. Then, the pump clock signal CLK_PUMP may be maintained at a high level for as many clock cycles as a predetermined counter value associated with the counter 1007. For example, if the predetermined counter value is 3, then the pump clock signal CLK_PUMP may be maintained at a high level for 3 clock cycles.

The predetermined counter value may be predetermined based on the reaction speed of the electronic device (10 in FIG. 1). In some embodiments, the period during which the detection signal DET is maintained at a certain level may be based on the period until the counting result of the detection signal DET satisfies a predetermined threshold value.

At time point t108, the second flip-flop 1009 may output the flip-flop output signal FF_OUT at a high level in response to the falling edge of the clock signal CLK. The first selector 1011 may output the counter output signal CNT_OUT at a low level as the selector output signal MUX_OUT according to the flip-flop output signal FF_OUT at a high level. Accordingly, the selector output signal MUX_OUT may transition to a low level.

At time point t109, the second flip-flop 1009 may output the flip-flop output signal FF_OUT at a high level in synchronization with the falling edge of the clock signal CLK. The first selector 1011 may output the count output signal CNT_OUT according to the flip-flop output signal FF_OUT at a high level. Accordingly, the selector output signal MUX_OUT may transition to a high level in response to the count output signal CNT_OUT at a high level.

At time point t109, the counter output signal CNT_OUT may transition to a high level.

When the predetermined count value of the counter 1007 is 3, the counter output signal CNT_OUT may transition to a high level the moment the clock signal CLK has a rising edge for the third time. Since the flip-flop output signal FF_OUT maintains a high level, the first selector 1011 may output the counter output signal CNT_OUT as the selector output signal MUX_OUT. That is, the selector output signal MUX_OUT may transition to a high level.

The third flip-flop 1013 receives the selector output signal MUX_OUT through a clock terminal, and the input terminal D is input to the output terminal Q, so the third flip-flop 1013 may latch and output the selector output signal MUX_OUT synchronized with the rising edge of the selector output signal MUX_OUT. The second selector 1019 may output the output of the second inverter 1017 as the pump clock signal CLK_PUMP based on the setup signal SETUP_END at a high level. Accordingly, the pump clock signal CLK_PUMP may transition to a low level.

At time point t111, the counter output signal CNT_OUT may transition to a low level.

Since the flip-flop output signal FF_OUT maintains a high level, the first selector 1011 may output the counter output signal CNT_OUT as the selector output signal MUX_OUT. That is, the selector output signal MUX_OUT may transition to a low level.

The third flip-flop 1013 receives the selector output signal MUX_OUT through a clock terminal, and the input terminal D is input to the output terminal Q, so the third flip-flop 1013 may latch and output the voltage of the first terminal N1 synchronized with the rising edge of the selector output signal MUX_OUT. The second selector 1019 may output the output of the second inverter 1017 as the pump clock CLK_PUMP based on the setup signal SETUP_END at a high level. Accordingly, the pump clock signal CLK_PUMP may be maintained at a low level.

At time point t113, the detection signal DET may transition to a low level. The setup signal SETUP_END may maintain a high level in response to the detection signal DET at a low level at time point t113.

At time point t113, the second flip-flop 1009 may output the flip-flop output signal FF_OUT at a low level in response to the falling edge of the clock signal CLK. The first selector 1011 may output the detection signal DET as the selector output signal MUX_OUT according to the flip-flop output signal FF_OUT at a low level. Accordingly, the selector output signal MUX_OUT may be maintained according to the detection signal DET.

Thereafter, operations during time points t115 to t117 may be similar to operations during time point t107 to t109.

As shown in FIG. 5, the clock control block 1000 according to an embodiment may change the pump clock signal CLK_PUMP based on the time point when the detection signal DET changes. For example, the pump clock signal CLK_PUMP may transition from a low level to a high level or from a high level to a low level in response to a rising edge of the detection signal DET. Additionally, the pump clock signal CLK_PUMP may transition from a high level to a low level or from a low level to a high level in response to a rising edge of the counter output signal CNT_OUT. That is, the on-duty period of the pump clock signal CLK_PUMP may be determined based on the detection signal DET. Additionally, the off-duty period of the pump clock signal CLK_PUMP may be determined based on the counter output signal CNT_OUT.

Additionally, the clock control block 1000 may change the frequency of the pump clock signal CLK_PUMP in conjunction with the detection signal DET by changing the predetermined count value. Accordingly, the clock control block 1000 may reduce the phenomenon of over-pumping the charge pump voltage V_PUMP. That is, the ripple voltage of the charge pump voltage V_PUMP may be reduced.

Figure 6:
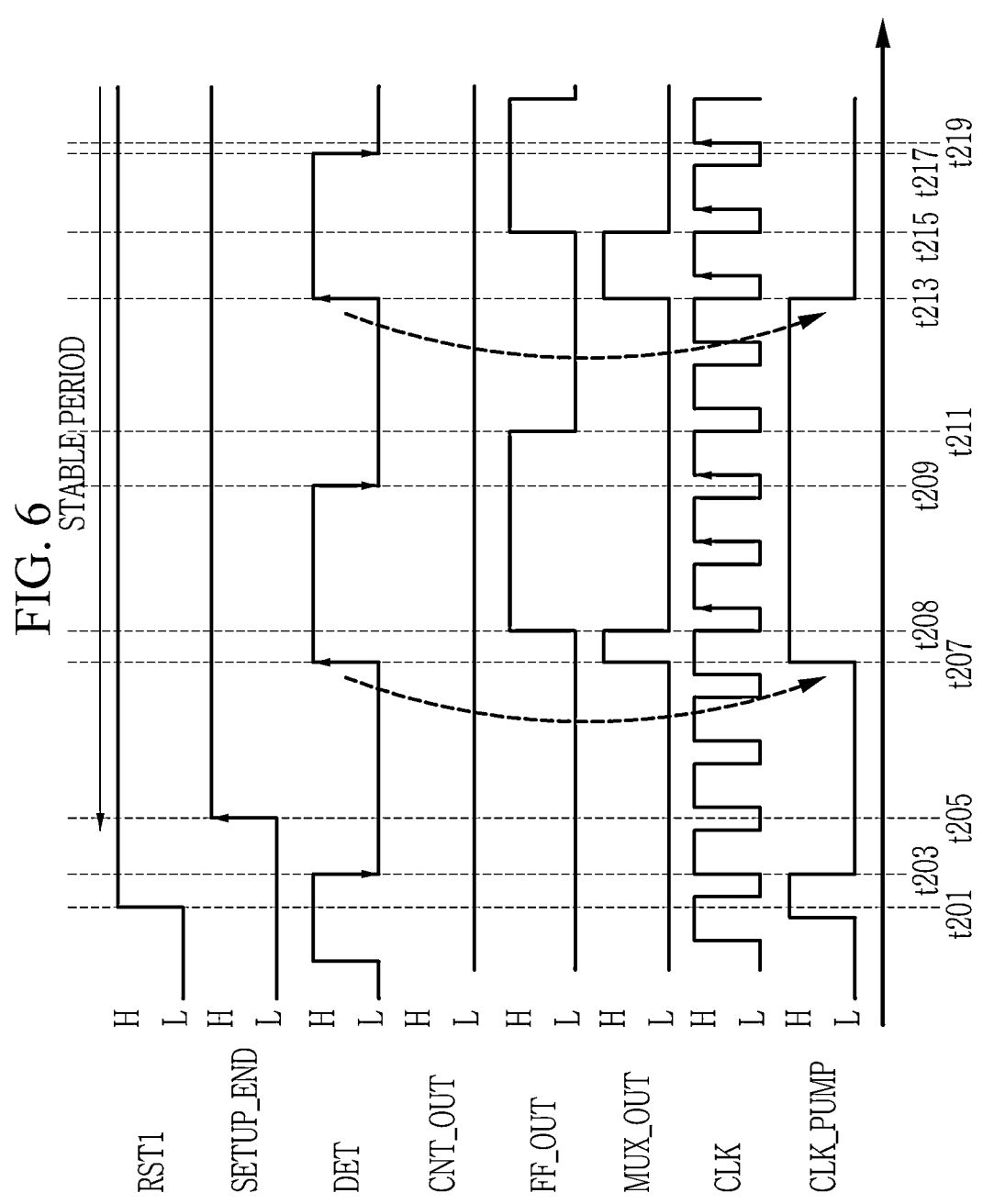
FIG. 6 is a timing diagram illustrating an operation of the clock control block of FIG. 4 according to an embodiment.

FIG. 6 is a timing diagram illustrating the operation of the clock control block of FIG. 4 according to an embodiment.

Specifically, FIG. 6 illustrates the first reset signal RST1, the first setup signal SETUP_END, the detection signal DET, the counter output signal CNT_OUT, the flip-flop output signal FF_OUT, the selector output signal MUX_OUT, the clock CLK and the pump clock signal CLK_PUMP. At this time, FIG. 6 illustrates a case where the change in the detection signal DET is faster than the operation of the counter output signal CNT_OUT.

The first reset signal RST1 transitions to a high level at time point t201.

At this time, the detection signal DET may be at a high level. The detection signal DET at a high level may indicate when the charge pump voltage V_PUMP is located in the setup section. The first setup signal SETUP_END may be maintained at a low level by the detection signal DET at a high level. Accordingly, the clock control block 1000 may output the clock signal CLK as the pump clock signal CLK_PUMP.

At time point t203, the detection signal DET may transition from high level to low level.

At time point t205, the setup signal SETUP_END may transition to a high level in response to the detection signal DET at a low level.

Thereafter, the detection signal DET may transition from a low level to a high level at time point t207.

The first flip-flop 1001 may output the power source voltage VDD as the setup signal SETUP_END in response to the detection signal DET transitioning to a high level.

Accordingly, the detection signal DET at a high level and the setup signal SETUP_END at a high level may be input to the first AND gate 1003, and the first AND gate output signal AND_OUT may transition to a high level.

The first AND gate output signal AND_OUT at a high level and an inverted counter output signal CNT_OUT may be input to the second AND gate 1005. Accordingly, the second reset signal RST2 may have a high level.

During time points t207-*t*209, the counter 1007 may count the detection signal DET in synchronization with the high level of the clock signal CLK. For example, assume that the number of times predetermined in the counter 1007 is 3. For example, the pump clock signal CLK_PUMP may be maintained at a high level for 3 clock cycles when the predetermined count value of the counter 1007 is 3. The predetermined count value may be predetermined based on the reaction speed of the electronic device (10 in FIG. 1).

At time point t207, the detection signal DET may transition to a high level. Since the second flip-flop 1009 may output the detection signal DET in synchronization with the falling edge of the clock signal CLK, the flip-flop output signal FF_OUT may be maintained at a low level. The first selector 1011 may output the detection signal DET according to the flip-flop output signal FF_OUT at a low level. Accordingly, the selector output signal MUX_OUT may transition to a high level in response to the detection signal DET at a high level.

At time point t208, the second flip-flop 1009 may output the detection signal DET at a high level as the flip-flop output signal FF_OUT in response to the falling edge of the clock signal CLK. The selector 1011 may output the counter output signal CNT_OUT as the selector output signal MUX_OUT according to the flip-flop output signal FF_OUT at a high level. Accordingly, the selector output signal MUX_OUT may transition to a low level.

At time point t209, the detection signal DET may transition from a high level to a low level.

The setup signal SETUP_END may maintain a high level in response to the detection signal DET at a low level.

The flip-flop output signal FF_OUT may maintain a high level. Accordingly, the selector 1011 may output the counter output signal CNT_OUT as the selector output signal MUX_OUT) and the selector output signal MUX_OUT may be maintained at a low level. Accordingly, the pump clock signal CLK_PUMP may be maintained at a high level.

At time point t211, the clock signal CLK may transition from high level to low level.

The second flip-flop 1009 may output the detection signal DET as the flip-flop output signal FF_OUT in response to the falling edge of the clock signal CLK. That is, the flip-flop output signal FF_OUT may transition to a low level in response to the detection signal DET at a low level.

The first selector 1011 may output the detection signal DET as the selector output signal MUX_OUT by the flip-flop output signal FF_OUT at a low level. Accordingly, the selector output signal MUX_OUT may be maintained at a low level.

The third flip-flop 1013 receives the selector output signal MUX_OUT through a clock terminal, and the input terminal D is input to the output terminal Q, so the third flip-flop 1013 may latch and output the voltage of the first terminal N1 synchronized with the rising edge of the selector output signal MUX_OUT. Accordingly, the output of the third flip-flop 1013 may be maintained at a low level. The second selector 1019 may output the output of the second inverter 1017 as the pump clock signal CLK_PUMP based on the setup signal SETUP_END at a high level. Accordingly, the pump clock signal CLK_PUMP may be maintained at a high level.

At time point t213, the detection signal DET may transition from a low level to a high level. In response to the falling edge of the clock signal CLK, the flip-flop output signal FF_OUT may be maintained at a low level. The first selector 1011 may output the detection signal DET as the selector output signal MUX_OUT in response to the falling edge of the clock signal CLK. Accordingly, the selector output signal MUX_OUT may transition to a high level. In response to this, the pump clock signal CLK_PUMP may transition from high level to low level.

At time point t215, the first flip-flop 1009 may output the detection signal DET as the flip-flop signal FF_OUT in response to the falling edge of the clock signal CLK.

Accordingly, the flip-flop signal FF_OUT may transition to a high level. As the flip-flop signal FF_OUT transitions to a high level, the first selector 1011 may output the counter output signal CNT_OUT as the selector output signal MUX_OUT. Accordingly, the selector output signal MUX_OUT may transition to a low level.

At time point t217, the detection signal DET may transition to low level.

Operations after time point t219 may be similar to operations during time points t205 to t217.

As shown in FIG. 6, the clock control block 1000 according to an embodiment may change the pump clock signal CLK_PUMP based on the time point when the detection signal DET changes. For example, the pump clock signal CLK_PUMP may transition from a low level to a high level or from a high level to a low level in synchronization with the rising edge of the detection signal DET. That is, the on-duty period of the pump clock signal CLK_PUMP may be determined based on the detection signal DET.

Additionally, the clock control block 1000 may change the frequency of the pump clock signal CLK_PUMP by changing the predetermined count value. Accordingly, the clock control block 1000 may reduce the phenomenon of over-pumping the charge pump voltage V_PUMP. That is, the ripple voltage of the charge pump voltage V_PUMP may be reduced.

Figure 7:
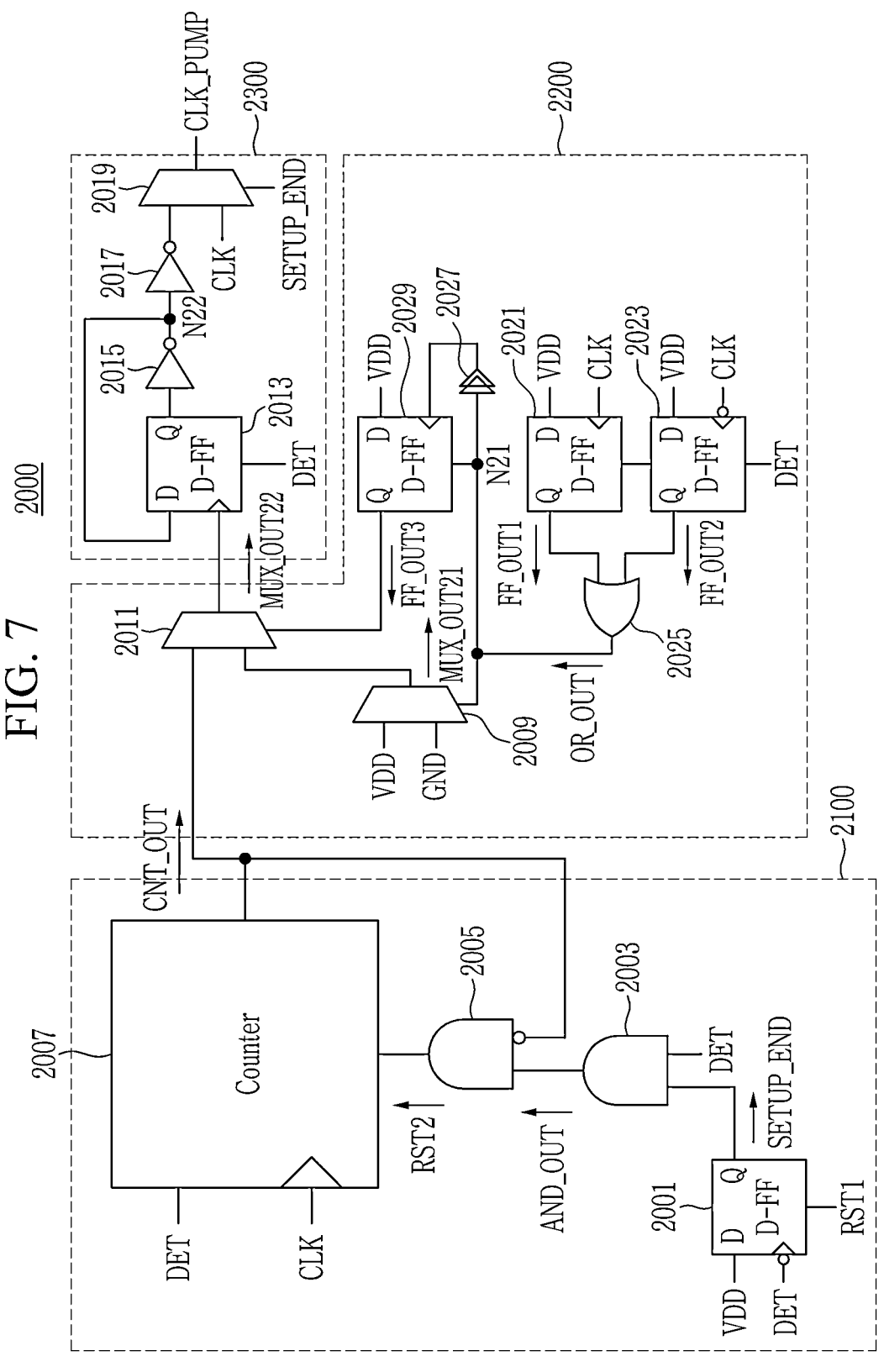
FIG. 7 is a diagram illustrating a clock control block that may be included in the voltage regulator system according to an embodiment.

FIG. 7 is a diagram illustrating a clock control block according to an embodiment.

Referring to FIG. 7, a clock control block 2000 may include a first circuit 2100, a second circuit 2200, and a third circuit 2300.

The description of each of the first circuit 1100 and the third circuit 1300 described with reference to FIG. 4 may be similarly applied to each of the first circuit 2100 and the third circuit 2300 in FIG. 7. For example, the clock control block 210 of FIG. 2 may be implemented by the clock control block 2000.

The first circuit 2100 may be a circuit that determines whether the clock control block 2000 operates. The first circuit 2100 may receive the first reset signal RST1, the power source voltage VDD, the detection signal DET, and the clock CLK to generate the counter output signal CNT_OUT.

The first circuit 2100 may include a first flip-flop 2001, a first AND gate 2003, a second AND gate 2005, and a counter 2007. The output terminal of the first flip-flop 2001 may be connected to the input terminal of the first AND gate 2003, the output terminal of the first AND gate 2003 may be input to the input terminal of the second AND gate 2005, and the output terminal of the second AND gate 2005 may be input to the counter 2007. The output of the counter 2007 may be transferred to the second circuit 2200.

The second circuit 2200 may be a circuit that determines whether to operate the clock skip mode. The second circuit 2200 may receive the power source voltage VDD, a ground voltage GND, the clock signal CLK, and the detection signal DET to output the selector output signal MUX_OUT.

The second circuit 2200 may include a 2_1 flip-flop 2021, a 2_2 flip-flop 2023, an OR gate 2025, a buffering circuit 2027, a 2_3 flip-flop 2029, a 2_1 selector 2009 (e.g., a selector circuit or multiplexer), and a 2_2 selector 2011 (e.g., a selector circuit or multiplexer). The output terminals of the 2_1 flip-flop 2021 and the 2_2 flip-flop 2023 may be connected to the OR gate 2025. The output terminal of the OR gate 2025 may be connected to the reset terminal of the 2_3 flip-flop 2029 and the buffering circuit 2027. The output terminal of the buffering circuit 2027 may be input to the clock terminal of the 2_3 flip-flop 2029. Additionally, the output terminal of the 2_1 selector 2009 may be connected to the input terminal of the 2_2 selector 2011. The output of the 2_2 selector 2011 may be transferred to the third circuit 2300.

The 2_1 flip-flop 2021 may receive the clock signal CLK through the clock terminal. The input terminal D of the 2_1 flip-flop 2021 may be connected to the power source voltage VDD. In some embodiments, the 2_1 flip-flop 2021 may be a D-flip-flop having the input terminal D and the output terminal Q. The 2_1 flip-flop 2021 may latch the power source voltage VDD in synchronization with the rising edge of the clock signal CLK, and output the power source voltage VDD as a first flip-flop output signal FF_OUT1.

The 2_1 flip-flop 2021 may be reset by the detection signal DET. When the detection signal DET is at a high level, the 2_1 flip-flop 2021 may be reset.

The 2_2 flip-flop 2023 may receive the inverted clock signal CLK through the clock terminal. The input terminal D of the 2_2 flip-flop 2023 may be connected to the power source voltage VDD. In some embodiments, the 2_2 flip-flop 2023 may be a D-flip-flop having the input terminal D and the output terminal Q. The 2_2 flip-flop 2023 may latch the power source voltage VDD in synchronization with the falling edge of the clock signal CLK, and output the power source voltage VDD as a second flip-flop output signal FF_OUT2.

The 2_2 flip-flop 2023 may be reset by the detection signal DET. When the detection signal DET is at a low level, the 2_2 flip-flop 2023 may be reset.

The OR gate 2025 may receive the first flip-flop output signal FF_OUT1 and the second flip-flop output signal FF_OUT2. The OR gate 2025 may perform an OR operation on the first flip-flop output signal FF_OUT1 and the second flip-flop output signal FF_OUT2. The OR gate 2025 may output the result of the OR operation as an OR output signal OR_OUT. The 2_1 flip-flop 2021 may respond to the rising edge of the clock signal CLK, and the 2_2 flip-flop 2023 may respond to the falling edge of the clock signal CLK, so the OR gate 2025 may respond to both the rising and falling edges of the clock signal CLK.

The buffering circuit 2027 may receive and buffer the OR output signal OR_OUT. The buffering circuit 2027 may transfer the buffered OR output signal OR_OUT to the 2_3 flip-flop 2029.

The 2_3 flip-flop 2029 may receive the buffered OR output signal OR_OUT through the clock terminal. The input terminal D of the 2_3 flip-flop 2029 may be connected to the power source voltage VDD. In some embodiments, the 2_3 flip-flop 2029 may be a D-flip-flop having the input terminal D and the output terminal Q. The 2_3 flip-flop 2029 may latch the power source voltage VDD in synchronization with the rising edge of the buffered OR output signal OR_OUT, and output the power source voltage VDD as a third flip-flop output signal FF_OUT3.

The 2_3 flip-flop 2029 may be reset by the OR output signal OR_OUT. When the OR output signal OR_OUT is at a low level, the 2_3 flip-flop 2029 may be reset.

The 2_1 selector 2009 may receive the power source voltage VDD and the ground voltage GND. The 2_1 selector 2009 may output the power source voltage VDD or the ground voltage GND as a first selector output signal MUX_OUT21 based on the OR output signal OR_OUT. In some embodiments, the ground voltage GND may be output when the OR output signal OR_OUT is at a low level, and the power source voltage VDD may be output when the OR output signal OR_OUT is at a high level.

The 2_2 selector 2011 may receive the first selector output signal MUX_OUT21 and the counter output signal CNT_OUT. The 2_2 selector 2011 may output the first selector output signal MUX_OUT21 or the counter output signal CNT_OUT as a second selector output signal MUX_OUT22 based on a third flip-flop output signal FF_OUT3. In some embodiments, when the third flip-flop output signal FF_OUT3 is at a low level, the first selector output signal MUX_OUT21 may be output, and when the third flip-flop output signal FF_OUT3 is at a high level, the counter output signal CNT_OUT may be output.

The third circuit 2300 may be a circuit that selects a signal output in the clock control block 2000. The third circuit 2300 may receive the second selector output signal MUX_OUT22, the detection signal DET and the first setup signal SETUP_END to output the pump clock signal CLK_PUMP.

The third circuit 2300 may include a third flip-flop 2013, a first inverter 2015, a second inverter 2017, and a second selector 2019 (e.g., a selection circuit or a multiplexer). The output terminal of the third flip-flop 2013 may be connected to the first inverter 2015, the output terminal of the first inverter 2015 may be connected to the input terminal D of the third flip-flop 2013 and the second inverter 2017, and the output terminal of the second inverter 2017 may be connected to the input terminal of the second selector 2019.

The clock control block 2000 according to an embodiment may generate the pump clock signal CLK_PUMP that operates in synchronization with the clock signal CLK rather than the detection signal DET.

Figure 8:
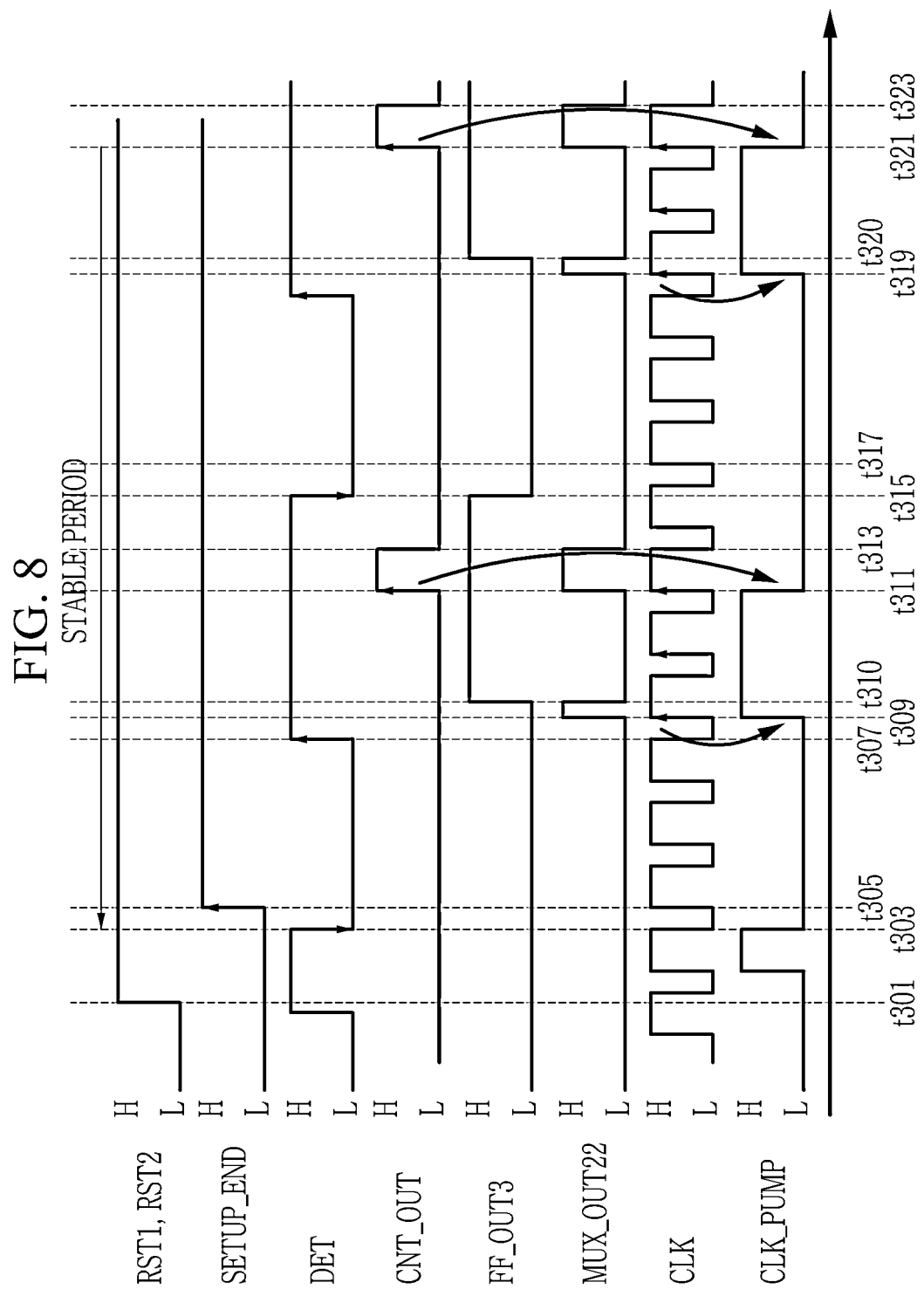
FIG. 8 is a timing diagram illustrating an operation of the clock control block of FIG. 7 according to an embodiment.

FIG. 8 is a timing diagram illustrating the operation of the clock control block of FIG. 7 according to an embodiment.

FIG. 8 illustrates the first reset signal RST1, the first setup signal SETUP_END, the detection signal DET, the counter output signal CNT_OUT, the flip-flop output signal FF_OUT3, the selector output signal MUX_OUT22, the clock signal CLK and the pump clock signal CLK_PUMP.

The first reset signal RST1 may transition to a high level at time point t301.

At this time, the detection signal DET may be at a high level. The detection signal DET at a high level may indicate when the charge pump voltage V_PUMP is located in the setup section. The first setup signal SETUP_END may be maintained at a low level by the detection signal DET at a high level.

The setup section may be used to quickly increase the charge pump voltage V_PUMP to reach the target level, so the clock skip mode need not operate.

Accordingly, the clock control block 2000 may output the clock signal CLK as the pump clock signal CLK_PUMP.

At time point t303, the detection signal DET may transition from a high level to a low level.

The detection signal DET at a low level may indicate when the charge pump voltage V_PUMP has entered a stable section. In some embodiments, the time for the charge pump voltage V_PUMP to reach the target level may be predicted and set in advance.

At time point t305, the setup signal SETUP_END may transition to a high level in response to the detection signal DET at a low level.

The detection signal DET may transition from low level to high level at time point t307.

The first flip-flop 2001 may output the power source voltage VDD as the setup signal SETUP_END in response to the detection signal DET transitioning to a low level.

Accordingly, the detection signal DET at a high level and the setup signal SETUP_END at a high level may be input to the first AND gate 1003, and the first AND gate output signal AND_OUT may transition to a high level.

The first AND gate output signal AND_OUT at a high level and an inverted counter output signal CNT_OUT may be input to the second AND gate 1005. Accordingly, the second reset signal RST2 may have a high level. Accordingly, the counter 2007 may start counting.

During time points t307-t313, the counter 2007 may count the detection signal DET in synchronization with the high level of the clock signal CLK. The pump clock signal CLK_PUMP may be maintained at a high level for as many clock cycles as the predetermined count value. For example, if the predetermined count value of the counter 2007 is 3, then pump clock signal CLK_PUMP may be maintained at a high level for 3 clock cycles. The predetermined count value may be predetermined based on the reaction speed of the electronic device (10 in FIG. 1).

At time point t309, the clock signal CLK may transition from low level to high level.

The 2-2 flip-flop 2023 may latch the power source voltage VDD in synchronization with the rising edge of the clock signal CLK, and the second flip-flop output signal FF_OUT2 may be at a high level. Accordingly, the OR gate output signal OR_OUT may be at a high level. The 2-1 selector 2009 may output the power source voltage VDD as the first selector output signal MUX_OUT21. At this time, since the third flip-flop signal FF_OUT3, which is a selection signal, is not generated, an initially set selection signal at a low level may be input to the 2_2 selector 2011.

Accordingly, the 2_2 selector 2011 may output the power source voltage VDD, which is the first selector output signal MUX_OUT21, as the second selector output signal MUX_OUT22. Therefore, as shown in FIG. 8, the second selector output signal MUX_OUT22 may transition to a high level.

At time point t310, that is, after a certain time has elapsed through the buffering circuit 2027 at time point t309, when the buffered OR gate output signal OR_OUT transitions from low level to high level, the 2_3 flip-flop 2029 may latch the power voltage VDD.

Accordingly, the third flip-flop signal FF_OUT3 may transition to a high level.

The 2-2 selector 2011 may output the counter output signal CNT_OUT by the third flip-flop signal FF_OUT3 at a high level. The third flip-flop 2013 may receive the counter output signal CNT_OUT at a clock terminal, and the counter output signal CNT_OUT may have a low level.

At this time, the second selector 2019 may output the output of the second inverter 2017 as the pump clock signal CLK_PUMP by the first setup signal SETUP_END. The pump clock signal CLK_PUMP may transition from a low level to a high level or from a high level to a low level in synchronization with the rising edge of the clock signal CLK.

At time point t311, the counter output signal CNT_OUT may transition to a high level.

When the predetermined count value of the counter 2007 is 3, the counter output signal CNT_OUT may transition to a high level the moment the clock signal CLK has a rising edge for the third time.

The 2-2 selector 2011 may output the counter output signal CNT_OUT as the second selector output signal MUX_OUT22 by the third flip-flop signal FF_OUT3 at a high level. Accordingly, the second selector output signal MUX_OUT22 may transition to a high level. The third flip-flop 2013 may receive the counter output signal CNT_OUT at a clock terminal, latch the voltage of a second node N22 in synchronization with the rising edge of the counter output signal CNT_OUT, and output the voltage of a second node N22.

At this time, the second selector 2019 may output the output of the second inverter 2017 as the pump clock signal CLK_PUMP by the first setup signal SETUP_END. The pump clock signal CLK_PUMP may transition from a high level to a low level or from a low level to a high level in synchronization with the rising edge of the clock signal CLK. Additionally, the pump clock signal CLK_PUMP may transition from a high level to a low level or from a low level to a high level in synchronization with the rising edge of the counter output CNT_OUT.

At time point t313, the count output signal CNT_OUT may transition to a low level.

The OR gate output OR_OUT may maintain a high level. The third flip-flop signal FF_OUT3 may also maintain a high level. The 2-2 selector 2011 may also output the count output signal CNT_OUT as the selector output signal MUX_OUT22. That is, the selector output signal MUX_OUT22 may transition from a high level to a low level.

At time point t315, the detection signal DET may transition to a low level.

Accordingly, the 2_1 flip-flop 2021 and the 2_2 flip-flop 2023 may be reset. Accordingly, the OR gate output OR_OUT may transition to a low level. Accordingly, the first selector output signal MUX_OUT21 may output the ground power supply GND as the first selector output signal MUX_OUT21. Additionally, the third flip-flop output signal FF_OUT3 may transition to a low level. While it is shown in FIG. 8 that the third flip-flop output signal (FF_OUT3) transitions directly to a low level at t315, embodiments are not limited thereto. For example, the third flip-flop output signal FF_OUT3 may transition to a low level after a certain time has elapsed from time point t315. Accordingly, the second selector output signal MUX_OUT22 may be maintained at a low level. At time point t317, the detection signal DET, the counter output signal CNT_OUT, the third flip-flop output signal FF_OUT3, and the second selector output signal MUX_OUT22 may be at low level.

Thereafter, operations during time points t319 to t323 may be similar to operations during time points t309 to t313.

As shown in FIG. 8, the clock control block 2000 according to an embodiment may change the pump clock signal CLK_PUMP based on the time point when the clock CLK signal changes. For example, the pump clock signal CLK_PUMP may transition from a low level to a high level or from a high level to a low level in response to a rising edge of the clock signal CLK. Additionally, the pump clock signal CLK_PUMP may transition from a high level to a low level or from a low level to a high level in response to a rising edge of the counter output CNT_OUT. That is, the on-duty period and off-duty period of the pump clock signal CLK_PUMP may be determined based on the detection signal DET and the counter output CNT_OUT.

As described in FIG. 6, when the variation of the detection signal DET is faster than the operation of the counter output signal CNT_OUT, the rising edge of the counter output CNT_OUT does not occur. Therefore, after the detection signal DET transitions from low level to high level, it may be synchronized at the point when the first clock signal CLK transitions, allowing the pump clock signal CLK_PUMP to transition from high level to low level, or from low level to high level.

Additionally, the clock control block 2000 may change the frequency of the pump clock signal CLK_PUMP by changing the predetermined count value of the counter. Accordingly, the clock control block 2000 may reduce the phenomenon of over-pumping the charge pump voltage V_PUMP. That is, the ripple voltage of the charge pump voltage V_PUMP may be reduced.

In some embodiments, a signal for controlling an arbitrary external device may be a signal synchronized with the clock signal CLK. The clock control block 2000 according to an embodiment may generate the pump clock signal CLK_PUMP that operates in synchronization with the clock signal CLK. Accordingly, the clock control block 2000 may generate the voltage pump (230 in FIG. 1) and the voltage regulator 250 may generate the charge pump voltage V_PUMP that is synchronized with the clock signal CLK.

Figure 9:
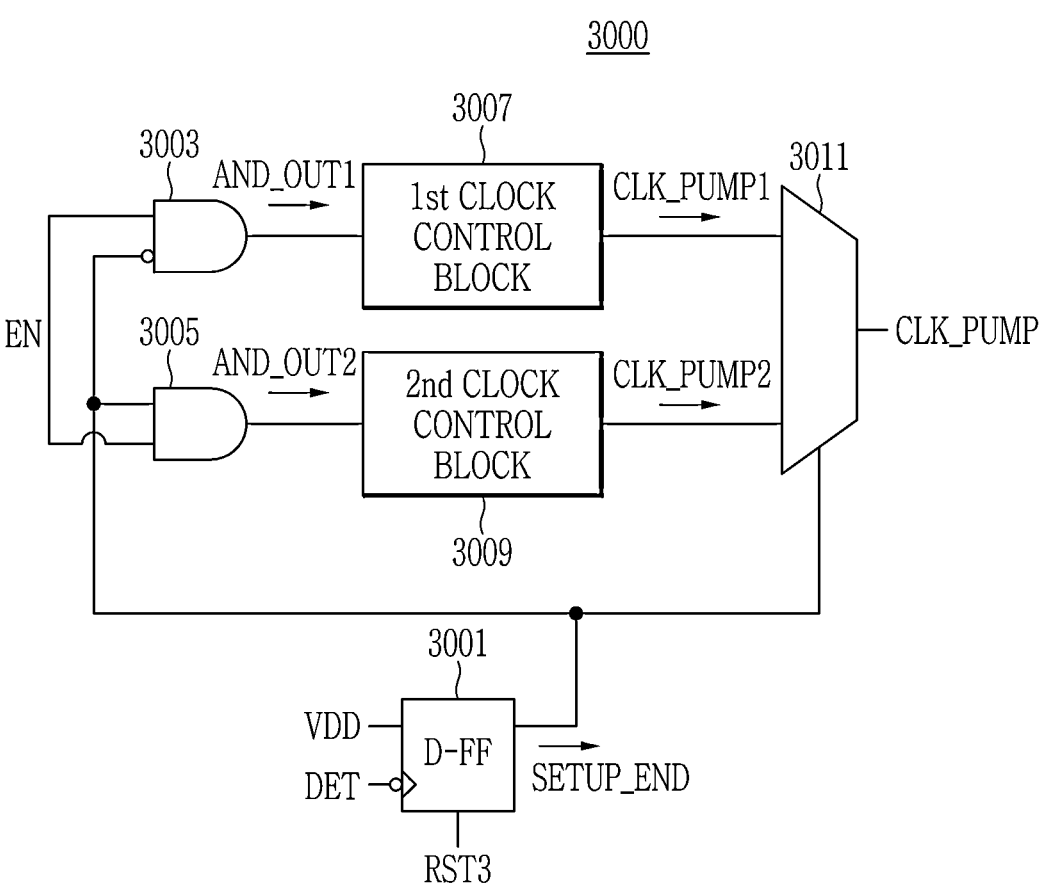
FIG. 9 is a diagram illustrating a clock control block according to an embodiment.

FIG. 9 is a diagram illustrating a clock control block according to an embodiment.

As shown in FIG. 9, a clock control block 3000 may include a first flip-flop 3001, a first AND gate 3003, a second AND gate 3005, a first clock control block 3007, a second clock control block 3009 and a selector 3011. The clock control block 210 of FIG. 2 may be implemented by the clock control block 3000.

The output terminal of the first flip-flop 3001 may be connected to the second input terminal of the first AND gate 3003 and the first input terminal of the second AND gate 3005. The first input terminal of the first AND gate 3003 may be connected to the second input terminal of the second AND gate 3005. The output terminal of the first AND gate 3003 may be connected to the first clock control block 3007, and the output terminal of the second AND gate 3005 may be connected to the second clock control block 3009. The outputs of the first clock control block 3007 and the second clock control block 3009 may be connected to the input terminal of the selector 3011.

The first flip-flop 3001 may receive the detection signal DET through a clock terminal. The input terminal D of the first flip-flop 3001 may be connected to the power source voltage VDD. In some embodiments, the first flip-flop 3001 may be a D-flip-flop having the input terminal D and the output terminal Q. The first flip-flop 3001 may latch the power source voltage VDD in synchronization with the falling edge of the detection signal DET and output the power source voltage VDD as a first setup signal SETUP_END.

The first flip-flop 3001 may be reset by the reset signal RST. When the reset signal RST is at a low level, the first flip-flop 3001 may be reset. In some embodiments, the reset signal RST may be a signal received from the outside to control whether the clock control block 3001 operates.

The first AND gate 3003 may receive an enable signal EN and the inverted first setup signal SETUP_END, and perform AND operation on the enable signal EN and the inverted first setup signal SETUP_END. The first AND gate 3003 may output the result of the AND operation as a first AND output signal AND_OUT1. The output of the first AND gate 3003 may be connected to the first clock control block 3007.

The second AND gate 3005 may receive the enable signal EN and the first setup signal SETUP_END, and perform an AND operation on the enable signal EN and the first setup signal SETUP_END. The second AND gate 3005 may output the result of the AND operation as a second AND output signal AND_OUT2. The output of the second AND gate 3005 may be connected to the second clock control block 3009.

In some embodiments, the first clock control block 3007 may be the clock control block 1000 of FIG. 4 or the clock control block 2000 of FIG. 7. Accordingly, the first clock control block 3007 may generate a first pump clock signal CLK_PUMP1 based on the clock signal CLK. Meanwhile, the second clock control block 3009 may use a power source voltage lower than the power source voltage VDD used in the first clock control block 3007. The second clock control block 3009 may generate a second pump clock signal CLK_PUMP2 based on the clock signal CLK.

The selector 3011 may receive the first pump clock signal CLK_PUMP1 and the second pump clock signal CLK_PUMP2. The selector 3011 may output the first pump clock signal CLK_PUMP1 or the second pump clock signal CLK_PUMP2 as the pump clock signal CLK_PUMP based on the first setup signal SETUP_END. In some embodiments, if the first setup signal SETUP_END is at a low level, the first pump clock signal CLK_PUMP1 may be output, and if the first setup signal SETUP_END is at a high level, the second pump clock signal CLK_PUMP2 may be output. Meanwhile, the clock control block 3000 may determine whether the first clock control block 3007 generates the first pump clock signal CLK_PUMP1 or the second clock control block 3009 generates the second pump clock signal CLK_PUMP2 by the enable signal EN.

Figure 10:
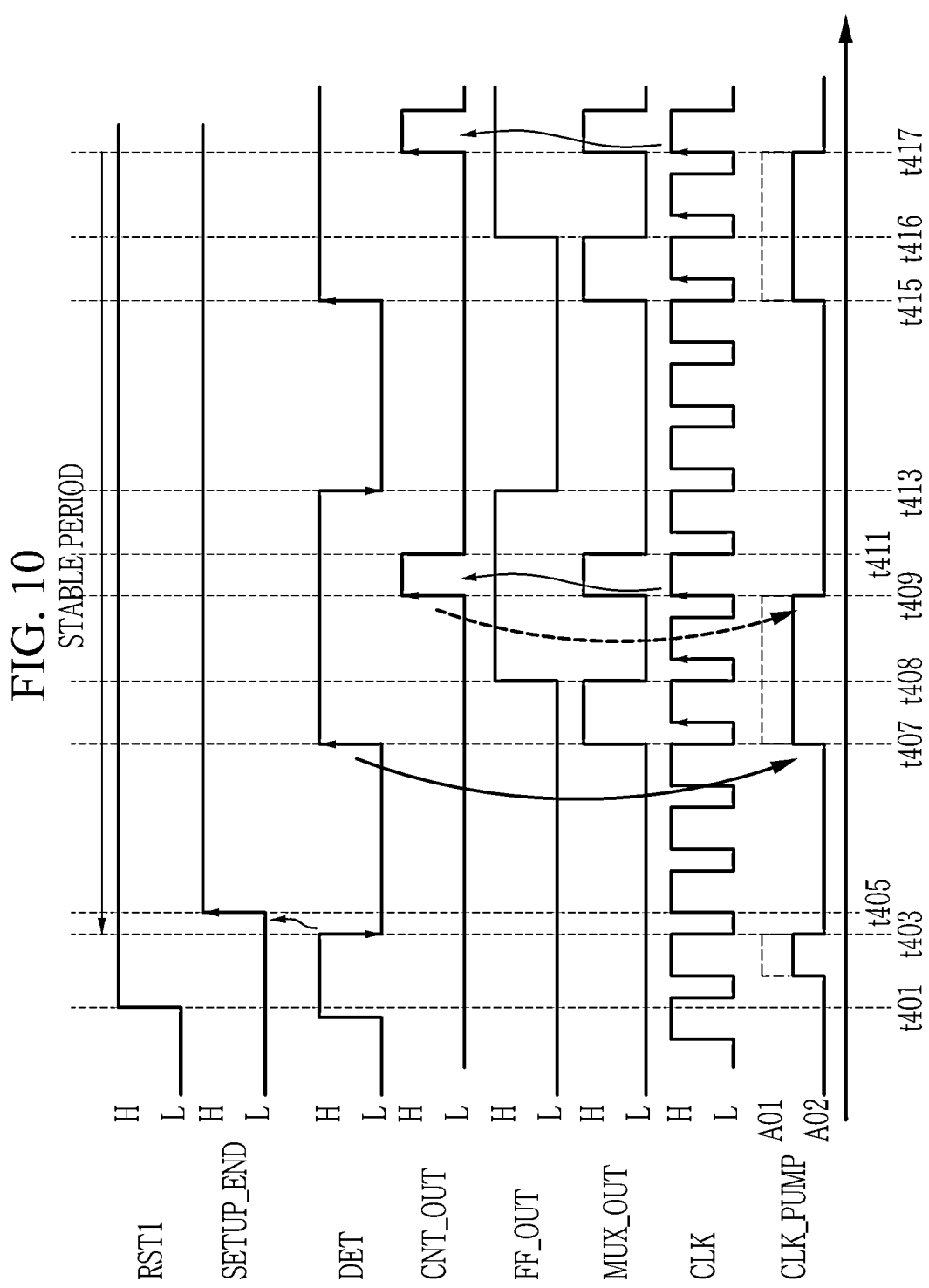
FIG. 10 is a timing diagram illustrating an operation of the clock control block of FIG. 9 according to an embodiment.

FIG. 10 is a timing diagram illustrating the operation of the clock control block of FIG. 9 according to an embodiment during time points t401-t417.

FIG. 10 illustrates the first reset signal RST1, the first setup signal SETUP_END, the reset detection signal DET, the counter output signal CNT_OUT, the flip-flop output signal FF_OUT, the selector output signal MUX_OUT, the clock signal CLK and the pump clock signal CLK_PUMP.

As described above, the voltage pump 230 may generate a pump voltage using the coupling phenomenon and charge sharing of a capacitor. Accordingly, the voltage pump 230 may take a certain amount of time to generate the charge pump voltage V_PUMP in response to the pump clock signal CLK_PUMP. If the speed at which the pump clock signal CLK_PUMP toggles is faster than the time for the voltage pump 230 to generate the charge pump voltage V_PUMP in response to the pump clock signal CLK_PUMP, the voltage pump 230 may continuously increase or decrease the voltage value of the charge pump voltage V_PUMP.

The first pump clock signal CLK_PUMP1 generated by the first clock control block 3007 may have a first amplitude A01. The second pump clock signal CLK_PUMP2 generated by the second clock control block 3009 may have a second amplitude A02. In an embodiment, the first amplitude A01 is greater than the second amplitude A02. That is, the charge pump voltage generated based on the second pump clock signal CLK_PUMP2 may increase with a lower slope than the charge pump voltage generated based on the first pump clock signal CLK_PUMP1. Accordingly, the second clock control block 3009 may reduce the phenomenon of over-pumping the charge pump voltage.

The charge pump voltage pump generated based on the first pump clock signal CLK_PUMP1 may increase with a higher slope than the charge pump voltage generated based on the second pump clock signal CLK_PUMP2.

Figure 11:
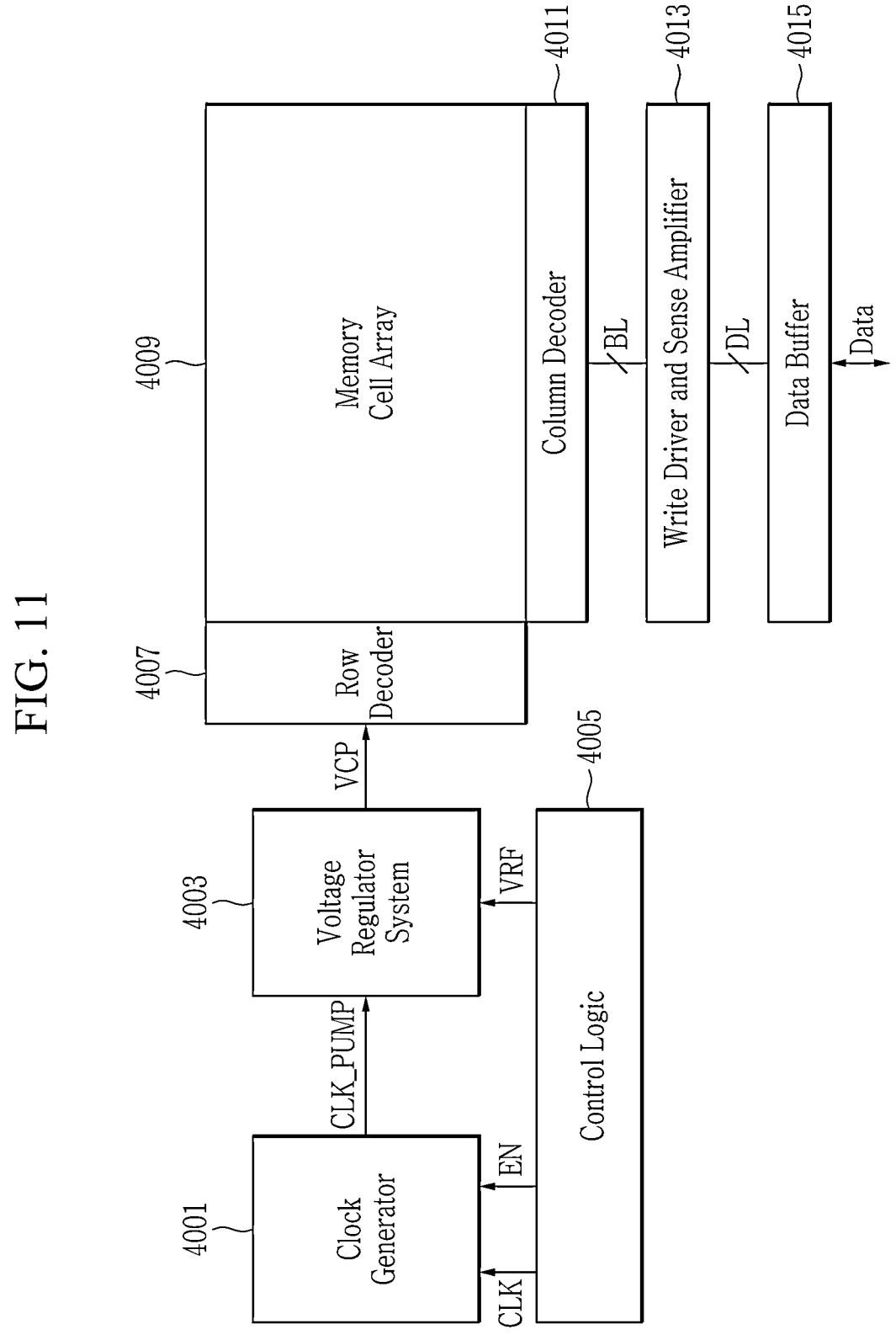
FIG. 11 is a block diagram illustrating a memory device according to an embodiment.

FIG. 11 is a block diagram illustrating a memory device according to an embodiment.

Referring to FIG. 11, a memory device may include a clock generator 4001, a voltage regulator system 4003, a control logic 4005 (e.g., a logic circuit), a memory cell array 4009, a row decoder 4007 (e.g., a decoder circuit), a column decoder 4011 (e.g., a decoder circuit), a write driver and a sense amplifier 4013, and a data buffer 4015. The clock generator 4001 and the voltage regulator 4003 may each correspond to the clock generator 100 and the voltage regulating system 200 of FIG. 1.

The clock generator 4001 may generate the pump clock signal CLK_PUMP based on the reference clock signal CLK and the activation signal EN. The clock generator 4001 may receive the activation signal EN from the control logic 4005. The activation signal EN may be a signal that activates the clock generating operation of the clock generator 4001. For example, the activation signal EN may be a signal indicating or instructing a write operation of the memory device.

The voltage regulator 4003 may generate the boost voltage VCP using the charge pump voltage V_PUMP based on the reference voltage VRF and the pump clock signal CLK_PUMP. Meanwhile, the pump clock signal CLK_PUMP may be a signal with a lower frequency than the reference clock signal. Alternatively, the pump clock signal CLK_PUMP may be a signal that has a smaller amplitude than the reference clock signal.

The reference voltage VRF may be a reference voltage for the memory device to generate the boost voltage VCP. The boost voltage VCP may be a write voltage required for a write operation of the memory device 4000. By generating the charge pump voltage V_PUMP based on the pump clock signal CLK_PUMP, the voltage regulator 4003 may generate a charge pump voltage with a smaller ripple and generate a less noisy boost voltage VCP than if the charge pump voltage were generated based on the reference clock signal CLK.

The voltage regulator 4003 may adjust a next charge pump voltage V_PUMP based on comparison of the reference voltage VRF and the previously generated charge pump voltage that is fed back to the voltage regulator 4003. The voltage regulator 4003 may perform the comparison in response to a rising edge, a falling edge, or a rising edge and a falling edge of the pump clock signal CLK_PUMP.

The voltage regulator 4003 may receive the reference voltage VRF from the control logic 4005. The voltage regulator 4003 may generate the charge pump voltage V_PUMP that maintains a constant voltage level through a feedback operation.

The control logic 4005 may output the activation signal EN and the reference clock signal CLK to the clock generator 4001, and the reference voltage VRF to the voltage regulator 4003. The control logic 4005 may receive a command indicating a write operation of the memory device 4000 from outside the memory device 4000 (e.g., a host, a memory controller, etc.).

The memory cell array 4009 may include a plurality of memory cells. The plurality of memory cells may store data.

The row decoder 4007 may be connected to the memory cell array 4009 through word lines. The row decoder 4007 may select one of the word lines based on a row address.

The column decoder 4011 may be connected to memory cells of the memory cell array 4009 through bit lines and source lines. The column decoder 4011 may select one of the bit lines and one of the source lines based on a column address.

The write driver and sense amplifier 4013 are connected to memory cells of the memory cell array 4009 through bit lines. In a read mode or a write mode, the write driver and sense amplifier 4013 may apply a write current (or voltage) to the bit line or detect the current (or voltage).

The data buffer 4015 is connected to the write driver and sense amplifier 4013 through data lines DL. The data buffer 4015 may exchange data with an external device. The data buffer 4015 may load data transferred from an external device to the write driver and the write driver of the sense amplifier 4013. The data buffer 4015 may transfer data sensed by the write driver and the sense amplifier 4013 to an external device.

In an embodiment, the memory device 4000 may be implemented as a non-volatile memory device. For example, the memory device 4000 may be a mass storage device.

In an embodiment, the memory device 4000 may be implemented with magnetoresistive random access memory (MRAM). However, the scope of the present disclosure is not limited thereto, and the memory device 4000 may also be implemented with various memory devices such as static RAM (SRAM), dynamic RAM (DRAM), thyristor RAM (TRAM), NAND flash memory, NOR flash memory, resistive RAM (RRAM), ferroelectric RAM (FRAM), and phase-change RAM (PRAM), and the like, in addition to MRAM.

While embodiments of the present disclosure have been described in detail, it is to be understood that the disclosure is not limited to the disclosed embodiments, but on the contrary, is intended to cover various modifications and equivalent arrangements included within the spirit and scope of the appended claims.

What is claimed is:

1. An electronic device, comprising:

a clock generator generating a first clock signal having a first frequency; and a voltage regulating system configured to receive the first clock signal, receive a detection signal indicating that a boost voltage is within a first voltage range, adjusts the first frequency of the first clock signal to generate a second clock signal having a second frequency based on a period during which the detection signal is maintained at a constant level, and generate the boost voltage based on the second clock signal, wherein the voltage regulating system counts the detection signal based on the first clock signal to generate a counting result, and wherein the period during which the detection signal is maintained is based on the period until the counting result satisfies a predetermined counting threshold value.

2. The electronic device of claim 1, wherein an on-duty period of the second clock signal is determined based on the detection signal.

3. The electronic device of claim 1, wherein the second clock signal is generated by skipping at least one pulse of the first clock signal while the detection signal is maintained.

4. The electronic device of claim 1, wherein the predetermined counting threshold value is predetermined based on a reaction speed of the electronic device.

5. The electronic device of claim 1, wherein the voltage regulating system comprises:

a clock control circuit configured to generate the second clock signal based on the detection signal and the first clock signal;

a voltage pump configured to generate a charge pump voltage based on the second clock signal; and a voltage regulator configured to generate the detection signal based on the charge pump voltage; and a voltage generator configured to generate the boost voltage based on the charge pump voltage.

6. The electronic device of claim 5, wherein the clock control circuit further receives a target voltage and transmits the target voltage to the voltage generator, wherein the voltage generator includes an amplifier including a first input terminal receiving the target voltage, a second input terminal receiving the charge pump voltage, and an output terminal configured to output the detection signal, wherein the charge pump voltage is input to the second input terminal through a capacitor.

7. The electronic device of claim 5, wherein the clock control circuit comprises:

a counter including a clock terminal receiving the first clock signal and an input terminal receiving the detection signal;

a first flip-flop including an input terminal receiving a power source voltage and a clock terminal receiving the detection signal inverted for outputting a setup signal;

a first AND gate receiving the setup signal and the detection signal; and a second AND gate receiving an output of the first AND gate and an output signal from the counter, wherein an output of the second AND gate is connected to a reset terminal of the counter.

8. The electronic device of claim 7, wherein the clock control circuit comprises:

a second flip-flop including a clock terminal receiving the first clock signal inverted and an input terminal receiving the detection signal; and a first selector receiving the output signal of the counter and the detection signal and controlled by an output of the second flip-flop.

9. The electronic device of claim 8, wherein the clock control circuit comprises:

a third flip-flop including a clock terminal receiving an output signal of the first selector and input terminal receiving a first signal;

a first inverter configured to invert an output of the third flip-flop;

a second inverter configured to invert an output of the first inverter; and a second selector receiving an output of the second inverter and the first clock signal and controlled by the setup signal, wherein the inverted output of the third flip-flop is fed back to the input terminal of the third flip-flop as the first signal.

10. The electronic device of claim 7, wherein the clock control circuit comprises:

a second flip-flop including a clock terminal receiving the first clock signal inverted and an input terminal receiving a power source voltage;

a third flip-flop including a clock terminal receiving the first clock signal and an input terminal receiving the power source voltage;

an OR gate receiving an output of the second flip-flop and an output of the third flip-flop;

a first selector receiving a ground voltage and the power source voltage and controlled by an output of the OR gate;

a fourth flip-flop including a clock terminal receiving an output of the OR gate and an input terminal receiving the power source voltage; and a second selector receiving an output of the first selector and an output signal of the counter and controlled by an output of the fourth flip-flop.

11. The electronic device of claim 10, wherein the clock control circuit comprises:

a fifth flip-flop including a clock terminal receiving an output signal of the second selector and an input terminal receiving a first signal;

a first inverter inverting an output of the fifth flip-flop;

a second inverter inverting an output of the first inverter; and a third selector receiving an output of the second inverter and the first clock signal and controlled by the setup signal, the inverted output of the fifth flip-flop is fed back to the input terminal of the fifth flip-flop as the first signal.

12. The electronic device of claim 1, wherein the first clock signal has a first amplitude, and wherein the second clock signal has a second amplitude that is smaller than the first amplitude.

13. The electronic device of claim 12, comprising:

a first flip-flop including a clock terminal receiving the detection signal inverted, including an input terminal receiving a power source voltage, and outputting a setup signal;

a first AND gate receiving the setup signal inverted and an enable signal, a second AND gate receiving the setup signal and the enable signal, a first clock control circuit configured to receive an output of the first AND gate to generate a first clock signal having the first amplitude;

a second clock control circuit configured to receive an output of the second AND gate to generate a second clock signal having the second amplitude; and a selector configured to receive an output of the first control circuit and an output of the second control circuit.

14. The electronic device of claim 13, wherein:

the selector selects the output of the first clock control circuit during a period when the detection signal is not maintained, and selects the output of the second clock control circuit during a period when the detection signal is maintained.

15. A method of operating an electronic device, comprising:

generating a first clock signal having a first frequency;

receiving a detection signal indicating a boost voltage is within a first voltage range;

counting the detection signal based on the first clock signal to generate a counting result;

adjusting the first frequency of the first clock signal based on a period when the detection signal is maintained for generating a second clock signal having a second frequency, wherein the period during which the detection signal is maintained is based on the period until the counting result satisfies a predetermined counting threshold value; and generating the boost voltage based on the second clock signal.

16. The method of operating the electronic device of claim 15, wherein the generating of the second clock signal comprises skipping at least one pulse of the first clock signal during a period when the detection signal is maintained.

17. An electronic device, comprising:

a clock generator configured to generate a first clock signal having a first frequency; and a voltage regulating system configured to receive the first clock signal, receive a detection signal indicating that a boost voltage is within a first voltage range, skip at least one pulse of the first clock signal based on a period during which the detection signal is maintained to generate a second clock signal having a second frequency, and generate the boost voltage based on the second clock signal, wherein the voltage regulating system comprises:

a clock control circuit configured to receive the first clock signal and the detection signal and generate the second clock signal based on the detection signal and the first clock signal;

a voltage pump configured to receive the second clock signal and generate a charge pump voltage based on the second clock signal;

a voltage regulator configured to receive the charge pump voltage and generate the detection signal based on the charge pump voltage; and a voltage generator different from the voltage pump and configured to receive the charge pump voltage and generate the boost voltage based on the charge pump voltage.

18. The electronic device of claim 17, wherein:

the voltage regulating system counts the detection signal based on the first clock signal to generate a counting result, the period during which the detection signal is maintained is a period until the counting result satisfies a predetermined counting threshold value.

* * * * *